United States Patent
Kawashima et al.

(10) Patent No.: US 6,841,459 B2
(45) Date of Patent: Jan. 11, 2005

(54) METHOD OF MANUFACTURING SEMICONDUCTOR DEVICE

(75) Inventors: Hiroshi Kawashima, Hyogo (JP); Motoshige Igarashi, Hyogo (JP); Keiichi Higashitani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 10/288,458

(22) Filed: Nov. 6, 2002

(65) Prior Publication Data

US 2003/0216015 A1 Nov. 20, 2003

(30) Foreign Application Priority Data

May 17, 2002 (JP) ........................ 2002-143278

(51) Int. Cl.⁷ ................... H01L 21/04; H01L 21/336
(52) U.S. Cl. .................. 438/510; 438/296; 438/305; 438/592
(58) Field of Search ............ 438/484–494, 438/296–305, 510, 744, 587–596, 522, 439, 448, 452, 769, 775, 786, 488, 532

(56) References Cited

U.S. PATENT DOCUMENTS

| | | | | |
|---|---|---|---|---|
| 3,615,936 A | * | 10/1971 | Batz ........................ | 438/370 |
| 4,755,478 A | * | 7/1988 | Abernathey et al. ...... | 438/296 |
| 5,215,932 A | * | 6/1993 | Manning .................. | 438/152 |
| 5,656,556 A | * | 8/1997 | Yang ....................... | 438/646 |
| 5,661,059 A | * | 8/1997 | Liu et al. ................. | 438/276 |
| 5,747,853 A | * | 5/1998 | So et al. .................. | 257/355 |
| 6,013,940 A | * | 1/2000 | Harada et al. ............ | 257/538 |
| 6,399,458 B1 | * | 6/2002 | Coolbaugh et al. ...... | 438/394 |
| 6,451,679 B1 | * | 9/2002 | Hu et al. ................. | 438/592 |
| 6,534,388 B1 | * | 3/2003 | Lin et al. ................ | 438/510 |
| 6,596,599 B1 | * | 7/2003 | Guo ........................ | 438/305 |
| 6,682,992 B2 | * | 1/2004 | Geiss et al. ............. | 438/488 |

FOREIGN PATENT DOCUMENTS

| | | |
|---|---|---|
| JP | 04-99037 | 3/1992 |
| JP | P2001-291862 A | 10/2001 |

* cited by examiner

*Primary Examiner*—Michael S Lebentritt
(74) *Attorney, Agent, or Firm*—McDermott Will & Emery LLP (57) ABSTRACT

A thermal process for activating respective impurities in a polysilicon film to be a gate electrode and a resistance element is performed with the polysilicon film to be the gate electrode and the resistance element being coated with an oxide film, after the respective impurities are implanted into the polysilicon film to be the gate electrode and the resistance element. Here, concentrations of the respective impurities in the polysilicon film to be the gate electrode and the resistance element are adjusted by controlling the thickness of the oxide film. The degree of impurity activation is thereby adjusted.

5 Claims, 5 Drawing Sheets

FIG.13 PRIOR ART

METHOD OF MANUFACTURING SEMICONDUCTOR DEVICE

BACKGROUND OF THE INVENTION

1. Field of the Invention

The present invention relates to a method of manufacturing a semiconductor device in which an impurity in a conductive silicon film having a prescribed pattern is activated by applying heat to the conductive film.

2. Description of the Background Art

Recently, a channel region of a transistor has been reduced in length with miniaturization of a semiconductor device. As a result, a short channel effect significantly affects transistor characteristics. Therefore, a drain engineering is increasingly important in order to suppress the short channel effect. A technique concerning impurity implantation for forming a LDD (Lightly Doped Drain) structure, an SPI (Shallow Pocket Implant) structure or the like is used as the drain engineering in a semiconductor device.

Furthermore, a conventional buried-channel type transistor cannot attain a sufficient drive capability as a drive voltage becomes smaller with a higher threshold voltage. Therefore, a surface-channel type transistor has been commonly used.

Figure 12:
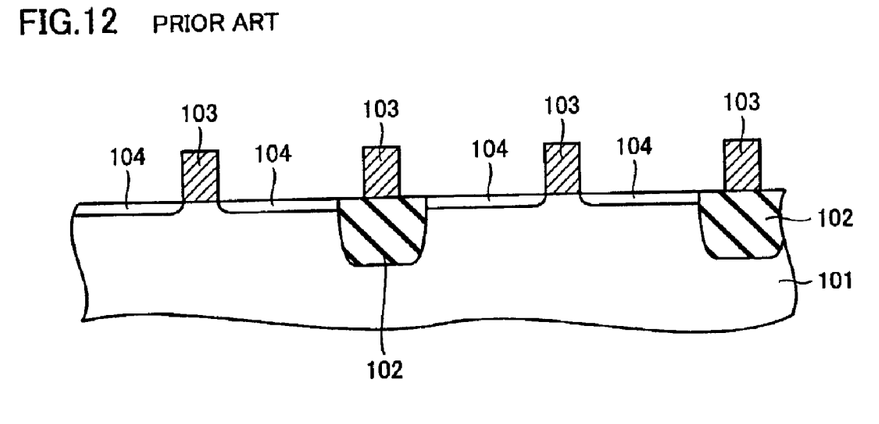
FIGS. 12 and 13 illustrate a conventional method of manufacturing a semiconductor device.
Figure 13:
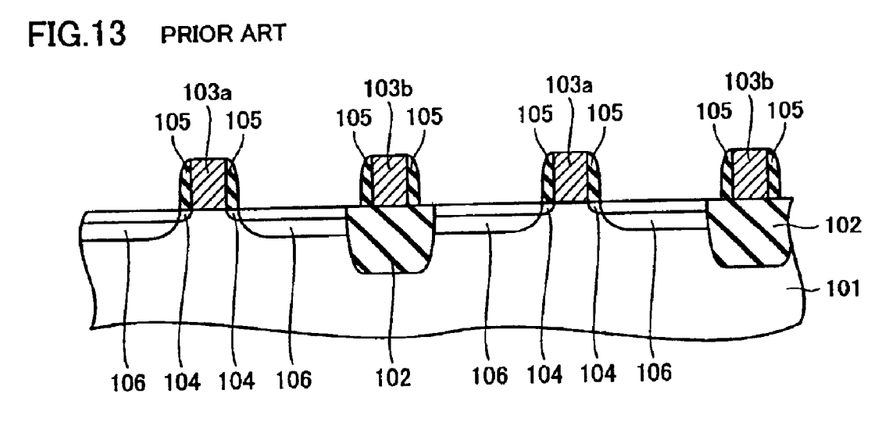

FIGS. 12 and 13 show the steps of manufacturing a semiconductor device including a P type field effect transistor and a resistance element using a polysilicon film doped with a P$^+$ type impurity, as an exemplary step of manufacturing a semiconductor device using the conventional technique described above.

In the conventional method of manufacturing a semiconductor device, through the steps shown in FIGS. 12 and 13, a semiconductor device is formed having an N type well region 101, an element isolation region 102, a P$^+$ type gate electrode 103a, a P$^+$ type resistance element 103b, a P$^-$ type impurity diffusion region 104, a sidewall insulating film 105 and a P type impurity diffusion region 106.

In the method of manufacturing a semiconductor device shown in FIGS. 12 and 13, first, N type well region 101 and element isolation region 102 are formed on a semiconductor substrate. Next, polysilicon film 103 which will be gate electrode 103a and resistance element 103b is formed by etching a polysilicon film non-doped or doped with an impurity into a prescribed pattern. Thereafter, in order to form P$^-$ type impurity diffusion region 104 to form a part of the LDD structure shown in FIG. 13, boron is implanted into an element formation region using polysilicon film 103 to be gate electrode 103a as a mask. As a result, the structure shown in FIG. 12 results.

Next, sidewall insulating film 105 made of a TEOS (Tetra Ethyle Ortho Silicate) oxide film and the like is formed on the side wall of the polysilicon film to be gate electrode 103a. Thereafter, in order to form P$^+$ type impurity diffusion region 106 having an impurity concentration higher than P$^-$ type impurity diffusion region 104, P$^+$ type gate electrode 103a and resistance element 103b of P$^+$ type polysilicon film, a step of implanting an impurity such as boron is performed. Then, a thermal process is performed to activate the respective impurities included in the polysilicon film as P$^+$ type gate electrode 103a and P$^+$ type resistance element 103b and P$^+$ type impurity diffusion region 106. The structure shown in FIG. 13 thereby results.

In the step of performing the thermal process as described above, the surfaces of impurity diffusion region 106 and the polysilicon film to be gate electrode 103a and resistance element 103b are bare, when heat is applied to the respective impurities included in impurity diffusion region 106 and the polysilicon film to be gate electrode 103a and resistance element 103b. Therefore, the respective impurities included in impurity diffusion region 106 and the polysilicon film to be gate electrode 103a and resistance element 103b diffuse outside thereof (out-diffusion).

As a result, the concentrations of the respective impurities included within impurity diffusion region 106, gate electrode 103a and resistance element 103b become low. In other words, the degree of impurity activation is reduced. Consequently, the transistor characteristics are deteriorated, resistance values of resistance elements become higher than desired values, and variations in resistance values of a plurality of resistance elements are increased.

The conventional method of manufacturing a semiconductor device has the following problem in the step of performing a thermal process for activating the impurity within the conductive silicon film having a prescribed pattern to be impurity diffusion region 106, gate electrode 103a and resistance element 103b and the like.

With the conventional method of manufacturing a semiconductor device described above, it is impossible to suppress reduction of the degree of impurity activation in the conductive silicon film having a prescribed pattern resulting from out-diffusion of impurity in the conductive silicon film having a prescribed pattern. Therefore, in a step of forming a pattern for each element, a conductive silicon film having a prescribed pattern having a desired resistance value cannot be formed.

Furthermore, in a semiconductor device in which an absolute value of resistance value of a resistance element is important, the following problem arises.

In forming a resistance element, plural kinds of extra resistance elements presumably having desired resistance values are formed in advance. Then, after prescribed manufacturing steps are once completed, a voltage is applied to a resistance element to be checked if it has a desired resistance value. If a desired resistance value is not obtained, a resistance element that attains a desired resistance value is re-formed using a resistance element selected from plural kinds of extra resistance elements by a trimming technique. This operation, however, requires a great deal of time.

Therefore, in a step of forming a resistance element having a prescribed pattern, it is urgently necessary to reduce the load of re-forming a desired resistance element using the aforementioned trimming technique by forming a resistance element having a desired resistance value.

SUMMARY OF THE INVENTION

An object of the present invention is to provide a method of manufacturing a semiconductor device allowing formation of a conductive silicon film having a prescribed pattern having a desired resistance value.

In accordance with a first aspect of the present invention, a method of manufacturing a semiconductor device includes the steps of forming a conductive silicon film having a prescribed pattern including an impurity, coating a surface of the conductive silicon film having a prescribed pattern with a coating film, and performing a thermal process for activating the impurity. An impurity concentration of the conductive silicon film is adjusted by controlling the thickness of the coating film. Therefore, the degree of impurity activation is adjusted.

In accordance with the method described above, the thermal process for activating an impurity is performed while the surface of the conductive silicon film having a prescribed pattern is coated with the coating film. Therefore, when the impurity is activated in the conductive silicon film having a prescribed pattern to which heat is applied, diffusion of that impurity from the surface of the conductive silicon film having a prescribed pattern to the outside thereof, that is, out-diffusion can be suppressed. As a result, it is possible to suppress reduction of the degree of impurity activation resulting from the out-diffusion of the impurity from the surface of the conductive silicon film having a prescribed pattern.

In addition, in accordance with the method described above, the degree of impurity activation is adjusted by controlling the thickness of the coating film, so that a conductive silicon film having a prescribed pattern having a desired resistance value can be formed.

In accordance with a second aspect of the present invention, a method of manufacturing a semiconductor device includes the steps of forming a conductive silicon film including an impurity, forming a coating film on an upper surface of the conductive silicon film, forming a conductive silicon film having a prescribed pattern including an impurity by etching the conductive film including an impurity using the coating film as a mask, and performing a thermal process for activating the impurity. In accordance with the second aspect of the present invention, an impurity concentration is adjusted by controlling the thickness of the coating film. Therefore, the degree of impurity activation is adjusted.

In accordance with the method described above, the thermal process for activating the impurity is performed while the coating film is formed on the upper surface of the conductive silicon film having a prescribed pattern. Therefore, similar to the first aspect of the present invention, it is possible to suppress reduction of the degree of impurity activation resulting from out-diffusion of impurity from the surface of the conductive silicon film having a prescribed pattern.

Furthermore, in accordance with the method described above, similar to the first aspect of the present invention, the degree of impurity activation is adjusted by controlling the thickness of the coating film, so that a conductive silicon film having a prescribed pattern having a desired resistance value can be formed.

In addition, in accordance with the method described above, while the coating film is left on the upper surface of the conductive silicon film having a prescribed pattern, impurity implantation for forming an impurity diffusion region can be performed using the conductive silicon film as a mask. Therefore, the distance in which the impurity implanted into the conductive silicon film formed in the element formation region penetrates the conductive silicon film formed in the element formation region to reach the semiconductor substrate, that is, a penetration margin can be increased by an amount of the thickness of the coating film. Therefore, a deeper impurity diffusion region can be formed without changing the impurity concentration of the semiconductor substrate below the conductive silicon film.

In accordance with a third aspect of the present invention, a method of manufacturing a semiconductor device includes the steps of forming a conductive silicon film having one prescribed pattern including an impurity that is coated with one coating film and a conductive silicon film having another prescribed pattern including an impurity that is coated with another coating film different from the one coating film in thickness, and performing a thermal process for activating the impurity.

In accordance with the method described above, the conductive silicon film having one prescribed pattern and the conductive silicon film having another prescribed pattern are formed each as the conductive silicon film having a prescribed pattern having desired conductivity.

Furthermore, in accordance with the method described above, the degree of impurity activation in the conductive film having one prescribed pattern can be differentiated from that in the conductive film having another prescribed pattern. Therefore, the resistance value in the conductive film having one prescribed pattern can be differentiated from that in the conductive silicon film having another prescribed pattern. As a result, a conductive film having plural kinds of prescribed patterns having different resistance values can be formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a method of manufacturing a semiconductor device in accordance with embodiments of the present invention will be described with reference to FIGS. 1 to 11.

(First Embodiment)

Referring to FIGS. 1 to 4, the method of manufacturing a semiconductor device in accordance with a first embodiment will be described.

Figure 1:
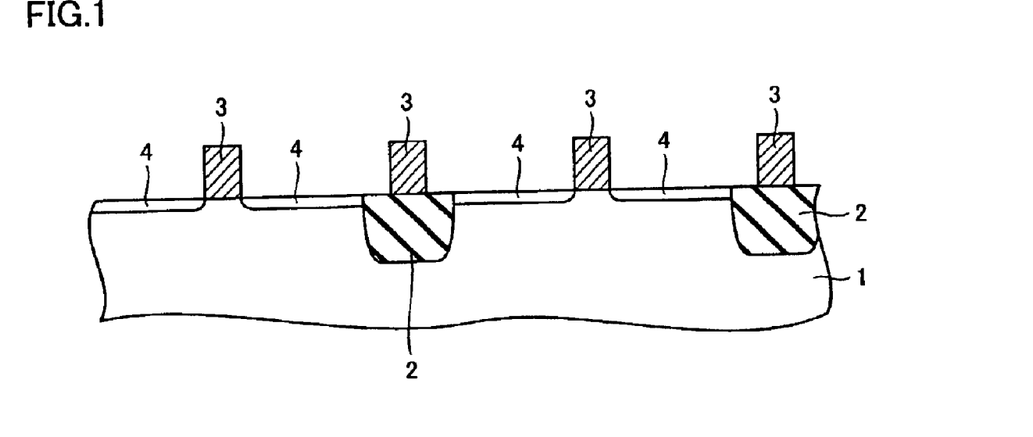
FIGS. 1 to 4 illustrate a method of manufacturing a semiconductor device in accordance with a first embodiment.

In the method of manufacturing a semiconductor device in the present embodiment, as shown in FIG. 1, an N well region 1 and an element isolation region (element isolation insulation film) 2 are first formed in a semiconductor substrate. A polysilicon film is then formed to cover element isolation region 2 and the element formation region. The polysilicon film is then etched into a prescribed pattern, so that polysilicon film 3 having a prescribed pattern to be a gate electrode and a resistance element is formed. Thereafter, in order to form a P⁻ type impurity diffusion region 4 to form an LDD structure, boron is diagonally implanted into the element formation region, resulting in the structure shown in FIG. 1.

Figure 2:
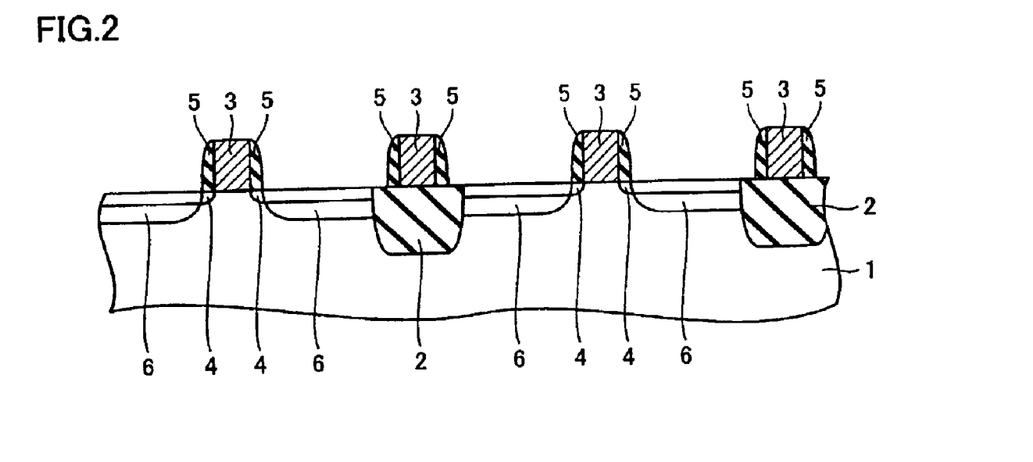

A sidewall insulating film 5 made of a TEOS oxide film or the like is formed on the side wall of polysilicon film 3 having a prescribed pattern to be a gate electrode and a resistance element, resulting in the structure shown in FIG. 2. Thereafter, a P$^+$ type impurity such as boron is implanted into the element formation region to form a P$^+$ type impurity diffusion region 6 having an impurity concentration higher than P$^-$ type impurity diffusion region 4. On the other hand, a P$^+$ type impurity such as boron is implanted into polysilicon film 3 to form a preliminary polysilicon film for forming P$^+$ type gate electrode 3a and P$^+$ type resistance element 3b shown in FIG. 3.

Figure 3:
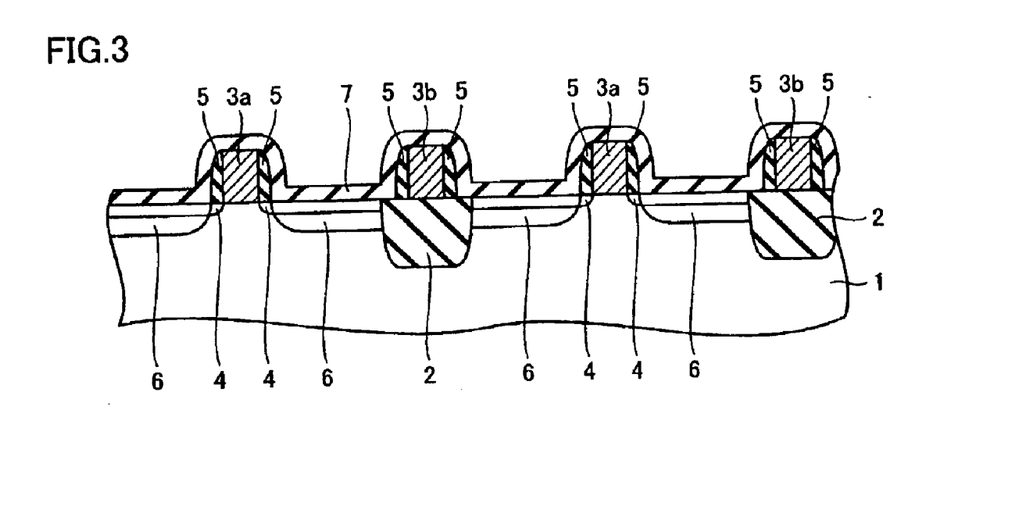

Thereafter, an oxide film 7 is formed to cover impurity diffusion region 4, impurity diffusion region 6 and the preliminary polysilicon film to be gate electrode 3a and resistance element 3b, using a CVD (Chemical Vapor Deposition) at a relatively low temperature of not more than 700° C., resulting in the structure shown in FIG. 3. A thermal process is then performed to activate the respective impurities in impurity diffusion region 4, impurity diffusion region 6 and the preliminary polysilicon film to be gate electrode 3a and resistance element 3b.

In the method of manufacturing a semiconductor device in accordance with the present embodiment, as described above, after the respective impurities are implanted into the preliminary polysilicon film to be gate electrode 3a and resistance element 3b as a conductive silicon film, a thermal process is performed to activate the respective impurities in the polysilicon film to be gate electrode 3a and resistance element 3b while the preliminary polysilicon film to be gate electrode 3a and resistance element 3b is coated with oxide film 7.

Therefore, reduction of impurity activation due to out-diffusion of the respective impurities implanted into the polysilicon film to be gate electrode 3a and resistance element 3b is suppressed in the polysilicon film to be gate electrode 3a and resistance element 3b. Accordingly, a transistor with a high drive capability and a resistance element having a stable resistance value can be formed at the same time.

Furthermore, though the P type field effect transistor and resistance element 3b doped with a P type impurity have been used in the method of manufacturing a semiconductor device in accordance with the present embodiment, the use of an N type field effect transistor and a resistance element doped with an N type impurity can attain the similar effect.

Though a polysilicon film has been used as a conductive silicon film having a prescribed pattern to form a gate electrode and a resistance element in the method of manufacturing a semiconductor device in accordance with the present embodiment, the use of an amorphous silicon film can attain the similar effect. Furthermore, though gate electrode 3a and resistance element 3b have been illustrated by way of example as a conductive silicon film having a prescribed pattern, the use of an interconnection layer as a conductive silicon film having a prescribed pattern can attain the similar effect.

Figure 4:
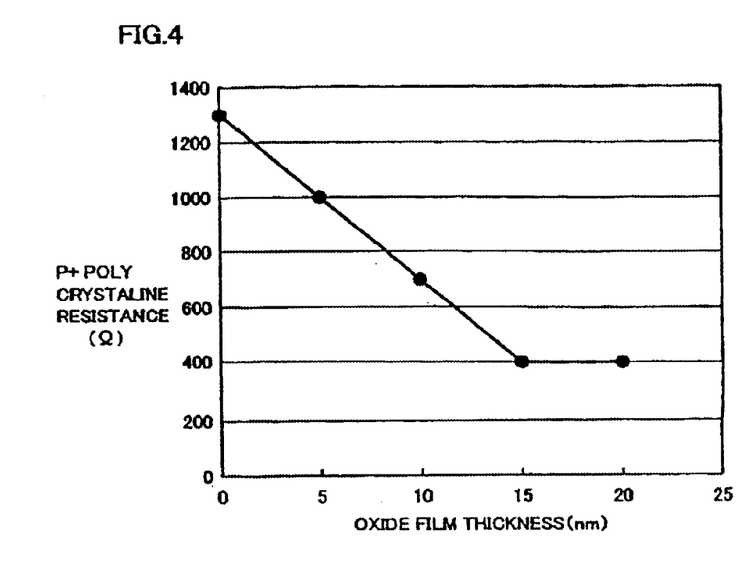

FIG. 4 shows, by way of example, the relation between the thickness of oxide film 7 coating gate electrode 3a or resistance element 3b and the resistance value of the P$^+$ type polysilicon film forming gate electrode 3a or resistance element 3b in accordance with the present embodiment. It is noted that, as shown in FIG. 4, if the thickness of oxide film 7 is not less than 15 nm, a resistance element having a stable resistance value of 400Ω can be obtained.

On the other hand, if the thickness of oxide film 7 is not more than 15 nm, the resistance value of gate electrode 3a or resistance value 3b becomes larger in a range from 400Ω to 1300Ω as the thickness of oxide film 7 becomes smaller. Therefore, in a case where the thickness of oxide film 7 is not more than 15 nm, the resistance value of gate electrode 3a or resistance element 3b can be determined if the thickness of oxide film 7 is determined.

In other words, determination of the thickness of oxide film 7 allows the resistance value of gate electrode 3a or resistance element 3b to be set at a desired value within a prescribed range. Therefore, in accordance with the method of manufacturing a semiconductor device of the present embodiment, gate electrode 3a or resistance element 3b can attain a desired resistance value without changing a structure (layout pattern), material and the like of gate electrode 3a or resistance element 3b.

It is noted that a semiconductor device manufactured by the method in the present embodiment described above includes gate electrode 3a or resistance element 3b and oxide film 7 coating gate electrode 3a or resistance element 3b. Furthermore, in the semiconductor device manufactured by the method in the present embodiment, gate electrode 3a or resistance element 3b has a resistance value obtained when a thermal process is performed immediately after oxide film 7 is formed on gate electrode 3a or resistance element 3b.

(Second Embodiment)

The method of manufacturing a semiconductor device in accordance with a second embodiment will now be described with reference to FIGS. 5A–5C.

Figure 5A:
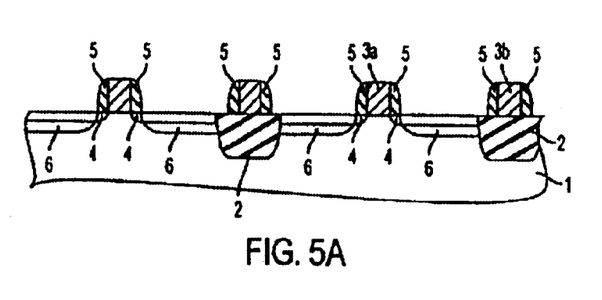
FIGS. 5A–5C illustrate a method of manufacturing a semiconductor device in accordance with a second embodiment.
Figure 5B:
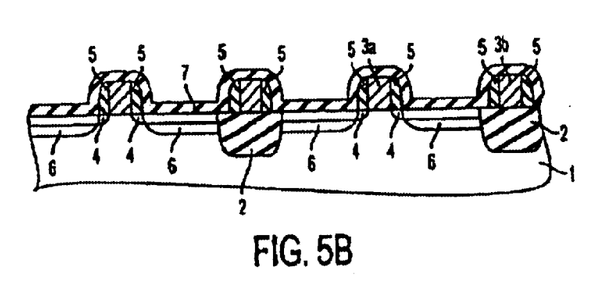
Figure 5C:
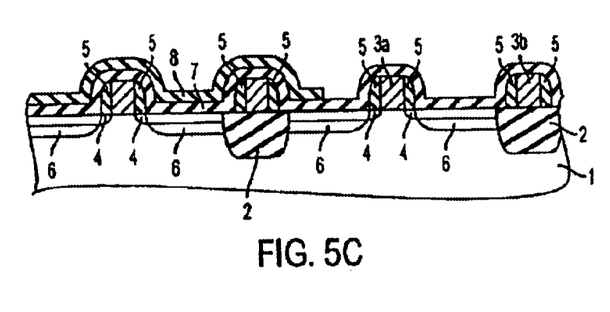

In the method of manufacturing a semiconductor device in accordance with the present embodiment, similar to the first embodiment, oxide film 7 is first formed to coat impurity diffusion region 4, impurity diffusion region 6 and the preliminary polysilicon to form gate electrode 3a and resistance element 3b, using CVD at a relatively low temperature of not more than 700° C., as shown in FIGS. 5A–5B. Then, an oxide film 8 is formed only on the upper side of the preliminary polysilicon film to be gate electrode 3a and resistance element 3b in a prescribed region while only oxide film 7 is formed on the upper side of the polysilicon film to be gate electrode 3a and resistance element 3b in the other region, as shown in FIG. 5C.

Thereafter, a thermal process is performed to activate the respective impurities in impurity diffusion region 4, impurity diffusion region 6 and the preliminary polysilicon film to be gate electrode 3a and resistance element 3b. More specifically, the thermal process for activating the respective impurities in the preliminary polysilicon film to be gate electrode 3a and resistance element 3b is performed on the condition that the thickness of the coating film coating the preliminary polysilicon film to be gate electrode 3a and resistance element 3b in a prescribed region is different from the thickness of the coating film coating the preliminary polysilicon film to be gate electrode 3a and resistance element 3b in the other region.

In accordance with the method described above, the degrees of suppressing the out-diffusion of the respective impurities can differ between the preliminary polysilicon film to be gate electrode 3a and resistance element 3b in a prescribed region provided with oxide films 7 and 8 and the preliminary polysilicon film to be gate electrode 3a and resistance element 3b in the other region provided only with oxide film 7.

Therefore, the degree of impurity activation in gate electrode 3a and resistance element 3b in a prescribed region provided with oxide film 7 and oxide film 8 can be differentiated from that in gate electrode 3a and resistance element 3b in the other region provided only with oxide film 7.

As a result, the respective resistance values in gate oxide film 3a and resistance element 3b in a prescribed region provided with oxide film 7 and oxide film 8 can be differentiated from the respective resistance values in gate electrode 3a and resistance element 3b in the other region provided only with oxide film 7. Therefore, plural kinds of gate electrode 3a and resistance element 3b having different resistance values can easily be formed.

Furthermore, the semiconductor device manufactured by the method according to the present embodiment described above has the following structure.

Gate electrode 3a and resistance value 3b in a prescribed region respectively have desired resistance values obtained when a thermal process is performed in a prescribed condition while oxide film 7 and oxide film 8 are formed respectively on gate electrode 3a and resistance element 3b in a prescribed region.

In addition, gate electrode 3a and resistance element 3b in the other region respectively have desired resistance values obtained when a thermal process is performed while oxide film 7 is formed respectively on gate electrode 3a and resistance element 3b in the other region.

(Third Embodiment)

The method of manufacturing a semiconductor device in accordance with a third embodiment will be described with reference to FIG. 6.

In the method of manufacturing a semiconductor device in accordance with the present embodiment, as described in the first embodiment with reference to FIG. 3, oxide film 7 is first formed to coat impurity diffusion region 4, impurity diffusion region 6 and the preliminary polysilicon film to be gate electrode 3a and resistance element 3b, using CVD at a relatively low temperature of not more than 700° C. Thereafter, as shown in FIG. 6, oxide film 7 is left in a prescribed region while oxide film 7 in the other region is removed by photolithography and etching.

Thereafter, while impurity diffusion region 4, impurity diffusion region 6, gate electrode 3a and resistance element 3b are covered with oxide film 7 in a prescribed region and impurity diffusion region 4, impurity diffusion region 6 and the polysilicon film to be gate electrode 3a and resistance element 3b are not covered with oxide film 7 in the other region, a thermal process is performed to activate the respective impurities in impurity diffusion region 4, impurity diffusion region 6 and the preliminary polysilicon film to be gate electrode 3a and resistance element 3b.

In accordance with the method described above, though out-diffusion of the impurities can be suppressed in the preliminary polysilicon film to be gate electrode 3a and resistance element 3b in a prescribed region covered with oxide film 7, out-diffusion of the impurities is not suppressed in the preliminary polysilicon film to be gate electrode 3a and resistance element 3b in the other region not covered with oxide film 7.

Accordingly, the degree of impurities activation in gate electrode 3a and resistance element 3b in a prescribed region covered with oxide film 7 can be differentiated from the degree of impurities activation in gate electrode 3a and resistance element 3b in the other region not covered with oxide film 7. Therefore, the respective resistance values of gate electrode 3a and resistance element 3b in a prescribed region covered with oxide film 7 can be differentiated from the respective resistance values of gate electrode 3a and resistance element 3b in the other region not covered with oxide film 7. As a result, plural kinds of gate electrode 3a and resistance element 3b having different resistance values can easily be formed.

Furthermore, the semiconductor device manufactured by the method in accordance with the present embodiment has the following structure.

Gate electrode 3a and resistance element 3b in a prescribed region respectively have desired resistance values obtained when a thermal process is performed in a prescribed condition while oxide film 7 having a prescribed thickness is formed respectively on gate electrode 3a and resistance element 3b in a prescribed region.

In addition, gate electrode 3a and resistance element 3b in the other region respectively have desired resistance values obtained when a thermal process is performed in a prescribed condition as described above while gate electrode 3a and resistance element 3b are exposed in the other region.

The method of manufacturing a semiconductor device includes the steps of forming a conductive silicon film having a prescribed pattern including an impurity that is coated with a coating film and a conductive film having another prescribed pattern including an impurity that is not coated with a coating film, and performing a thermal process for activating an impurity.

In accordance with the method described above, the conductive silicon film having a prescribed pattern that is covered with a coating film and the conductive silicon film having a prescribed pattern that is not covered with a coating film each can be formed as a conductive silicon film having a prescribed pattern having desired conductivity.

Furthermore, in accordance with the method described above, the degree of impurity activation in the conductive silicon film having a prescribed pattern coated with the coating film can be differentiated from that in the conductive silicon film having a prescribed pattern not covered with the coating film. Therefore, the resistance value in the conductive film having a prescribed pattern coated with the coating film can be differentiated from that in the conductive film having a prescribed pattern not covered with the coating film. As a result, a conductive silicon film having plural kinds of prescribed patterns having different resistance values can be formed.

(Fourth Embodiment)

Figure 7:
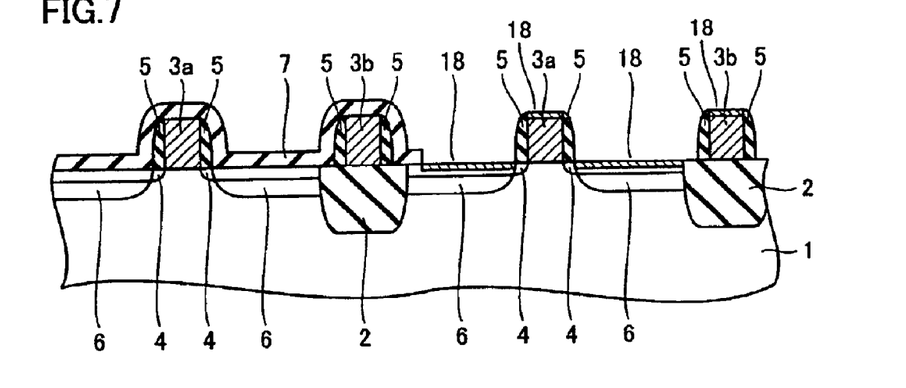
FIG. 7 illustrates the method of manufacturing a semiconductor device in accordance with a fourth embodiment.

The method of manufacturing a semiconductor device in accordance with a fourth embodiment will now be described with reference to FIG. 7.

Figure 6:
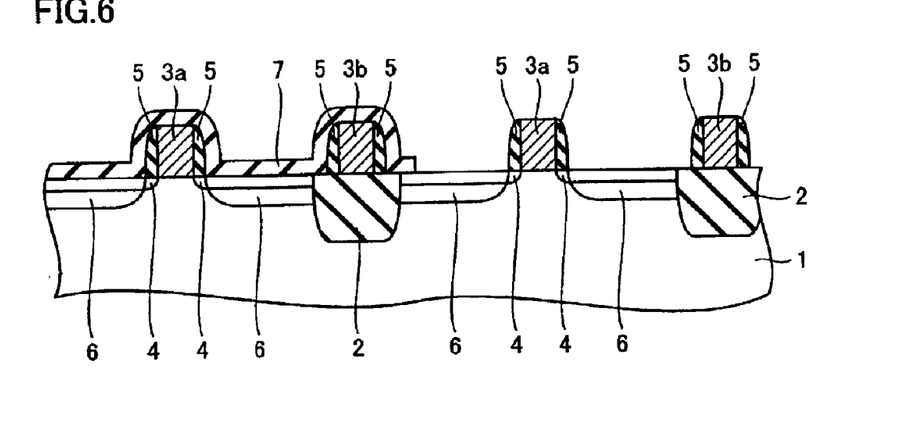
FIG. 6 illustrates the method of manufacturing a semiconductor device in accordance with a third embodiment.

In the method of manufacturing a semiconductor device in the present embodiment, as illustrated in the third embodiment with reference to FIG. 6, a thermal process is first performed to activate the respective impurities in the preliminary polysilicon film to be gate electrode 3a and resistance element 3b with only a prescribed region being covered with oxide film 7. Thereafter, using a refractory metal such as $CoSi_2$ and the like, silicide is formed on the respective upper surfaces of impurity diffusion region 6, gate electrode 3a and resistance element 3b in the other region from which oxide film 7 is removed, so that a refractory metal silicide film 18 is formed.

In the method of manufacturing a semiconductor device in the present embodiment, similar to the third embodiment, reduction of the degrees of impurity activation in gate electrode 3a and resistance element 3b is suppressed. Therefore, a transistor having a high drive capability and a resistance element having a stable resistance value can be formed at the same time.

Furthermore, oxide film 7 functions as a coating film that suppresses out-diffusion of the impurity in the step of activating the respective impurities in gate electrode 3a and resistance element 3b and also functions as a silicide protection film for gate electrode 3a, resistance element 3b and impurity diffusion region 6 in a prescribed region in the silicide formation step.

Accordingly, the steps of manufacturing a semiconductor device can be simplified. Furthermore, silicide is formed on the respective upper surfaces of gate electrode 3a and resistance element 3b in the other region, so that the transistor attains higher performance and the resistance element has a reduced sheet resistance.

The method of manufacturing a semiconductor device includes a first step of forming a conductive silicon film having a prescribed pattern including an impurity that is coated with a coating film, a second step of performing a thermal process for activating the impurity, and a third step of forming silicide on a surface of a silicon film by a refractory metal using the coating film as a protection film for the conductive silicon film having a prescribed pattern.

In accordance with the method described above, since the first and second steps are included, a conductive silicon film having a prescribed pattern having prescribed conductivity can be formed. Furthermore, in accordance with the method described above, since the coating film functions also as the protection film in the third step, the steps of manufacturing a semiconductor device can be simplified.

(Fifth Embodiment)

Figure 8:
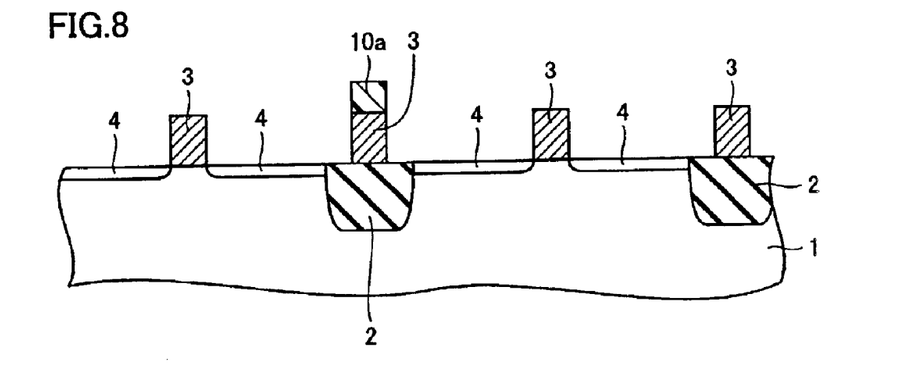
FIGS. 8 and 9 illustrate the method of manufacturing a semiconductor device in accordance with a fifth embodiment.
Figure 9:
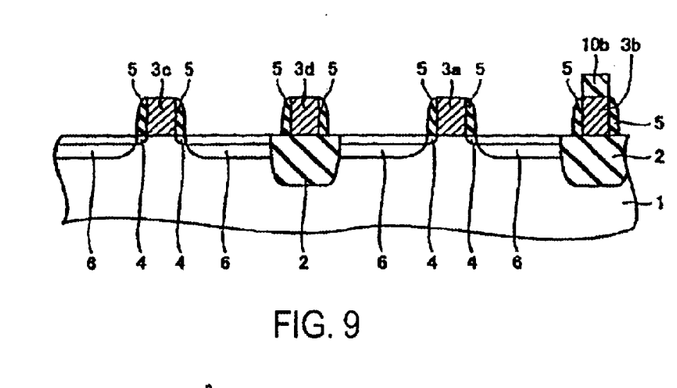

The method of manufacturing a semiconductor device in accordance with a fifth embodiment will now be described with reference to FIGS. 8 and 9.

In the method of manufacturing a semiconductor device in accordance with the first to fourth embodiments described above, the gate electrode and the resistance element using the polysilicon film doped with the impurity have a variety of resistance values depending on the amount of impurity implanted, kinds of impurities, the grain size of the polysilicon film and the like.

Therefore, in performing an impurity implantation step for forming impurity diffusion region 4, for providing an SPI structure to impurity diffusion region 4, or forming impurity diffusion region 6, prescribed gate electrode 3a or resistance element 3b into which desirably no impurity is implanted is masked in order to prevent impurity implantation in the prescribed gate electrode 3a or resistance element 3b.

Accordingly, by appropriately using the mask as described above, such a gate electrode 3a or resistance element 3b can be formed in that an impurity is implanted only in an impurity implantation step for forming impurity diffusion region 4, for providing the SPI structure to impurity diffusion region 4, or for forming impurity diffusion region 6.

The aforementioned method of manufacturing a semiconductor device in accordance with the present embodiment will now be described more specifically. For example, as shown in FIG. 8, impurity implantation is first performed to form impurity diffusion region 4 while only the upper surface of polysilicon film 3 to be a resistance element 3d shown in FIG. 9 is covered with a resist film 10a and the respective upper surfaces of the polysilicon film to be gate electrodes 3a and 3c and resistance element 3b shown in FIG. 9 remain bare. Next, after resist film 10a is removed, as shown in FIG. 9, impurity implantation for forming impurity diffusion region 6 is performed while only the upper surface of polysilicon film to be resistance element 3b is covered with a resist film 10b and the respective upper surfaces of polysilicon film to be gate electrodes 3a and 3c and resistance element 3d remain bare. Thereafter, a thermal process is performed to activate the impurities in gate electrodes 3a, 3c and resistance elements 3b, 3d.

In accordance with the method of manufacturing a semiconductor device in the present embodiment, resistance elements 3b, 3d are subjected to impurity implantation only in one particular impurity implantation step and not subjected to impurity implantation in the other impurity implantation step. As a result, the degree of impurity activation in the conductive silicon film having a prescribed pattern to be a resistance element can easily be adjusted.

(Sixth Embodiment)

The method of manufacturing a semiconductor device according to a sixth embodiment will now be described with reference to FIGS. 10A–10C and 11.

Figure 10A:
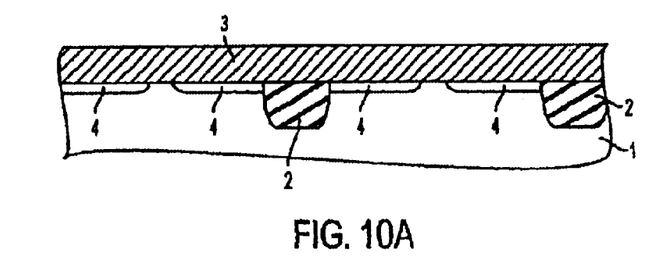
FIGS. 10A–10C and 11 illustrate the method of manufacturing a semiconductor device in accordance with a sixth embodiment.
Figure 10B:
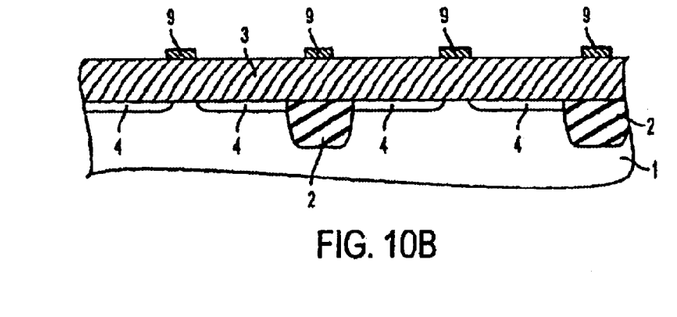
Figure 10C:
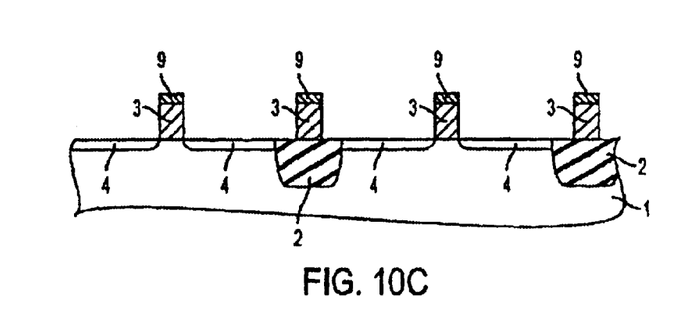

FIG. 10C shows the state immediately after polysilicon film 3 to be gate electrode 3a and resistance element 3b are formed using an inorganic material such as oxide film 9 as a mask, as illustrated in FIGS. 10A–10B. The structure shown in FIG. 10C is similar to that of FIG. 1 except that respective oxide films 9 are formed on polysilicon film 3 to be gate electrode 3a and resistance element 3b shown in FIG. 11.

Figure 11:
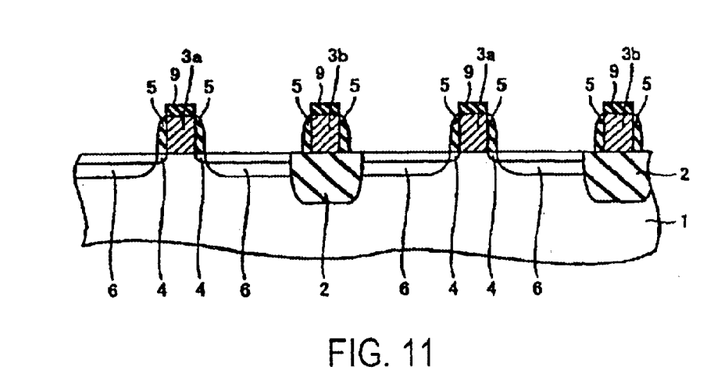

In the method of manufacturing a semiconductor device in accordance with the present embodiment, oxide film 9 used as a mask for forming gate electrode 3a and resistance element 3b shown in FIG. 11 is left until the step of impurity activation in the polysilicon film to be gate electrode 3a and resistance element 3b, which is performed after the step of implanting the respective impurities in the polysilicon film 3 to be gate electrode 3a and resistance element 3b. It is noted that impurity implantation is performed with such an implant energy in that a concentration peak of the implanted impurity is located under the bottom surface of oxide film 9, in the step of implanting the respective impurities into the polysilicon film to be gate electrode 3a and resistance element 3b.

Also in the method of manufacturing a semiconductor device according to the present embodiment, similar to the first to fifth embodiments, reduction of the degree of impurity implantation resulting from out-diffusion of impurity is suppressed in gate electrode 3a and resistance element 3b. Therefore, a transistor with a high drive capability and a resistance element having a stable resistance value can be formed at the same time.

Furthermore, when impurity is implanted to form impurity diffusion region 6 which will form a source/drain region shown in FIG. 11, gate electrode 3a is used as a mask. At this point, implant energy for impurity has to be high in order to form a deep impurity diffusion region 6. With higher implant energy, however, the impurity implanted in gate electrode 3a penetrates gate electrode 3a to reach a channel region.

In the method of manufacturing a semiconductor device according to the present embodiment, therefore, a distance traveled by the implanted impurity from the upper surface of oxide film 9 to the upper surface of the channel region, that is, a penetration margin is increased by an amount of the thickness of oxide film 9 by performing impurity implantation for forming impurity diffusion region 6 with oxide film 9 being left on gate electrode 3a.

Therefore, a deeper impurity diffusion region 6 can be formed. As a result, even when a refractory metal silicide film such as CoSi$_2$ formed on the upper surface of impurity diffusion region 6 causes spike, leak current is less likely to occur in a junction portion between impurity diffusion region 6 and N well region 1.

It is noted that it is possible to appropriately combine the features of the method of manufacturing a semiconductor device illustrated in the first to sixth embodiments.

Although the present invention has been described and illustrated in a detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a conductive silicon film having an upper surface prescribed pattern including an impurity;

coating the upper surface of the conductive silicon film having the prescribed pattern with a coating film; and performing a thermal process for activating said impurity while the coating film is on the upper surface of the conductive silicon film, wherein a concentration of said impurity is adjusted by controlling a thickness of said coating film.

2. A method of manufacturing a semiconductor device, comprising tees of:

forming a conductive silicon film having an upper surface and including an impurity;

forming a coating film on the upper surface of said conductive silicon film;

forming a conductive silicon film having a prescribed pattern including an impurity by etching said conductive silicon film including an impurity using said coating film as a mask; and performing a thermal process for activating said impurity while the coating film is on the upper surface of the conductive silicon film, wherein a concentration of said impurity is adjusted by controlling a thickness of said coating film.

3. A method of manufacturing a semiconductor device, comprising the steps of:

forming a conductive silicon film having an upper surface and one prescribed pattern including an impurity that is coated with one coating film and a conductive silicon film having an upper surface and another prescribed pattern including said impurity that is coated with another coating film different from said one coating film in thickness; and performing a thermal process for activating said impurity while the coating films are on the upper surface of the conductive silicon films.

4. A method according to claim 1, wherein the conductive silicon film is a resistance element having an upper surface and side surfaces, the method comprising coating the upper and side surfaces of the resistance element with the coating film and performing the thermal process while the coating film is on the upper and side surfaces of the resistance element.

5. A method of manufacturing a semiconductor device, the method comprising:

forming a transistor comprising:

a gate electrode, having an upper surface and side surfaces and formed of polysilicon containing an impurity, over a substrate with a gate dielectric layer therebetween;

lightly doped impurity diffusion regions in the substrate; and heavily doped impurity diffusion regions in the substrate;

coating the upper and side surfaces of the gate electrode and the heavily doped impurity diffusion regions with a coating film having a thickness; and heating to activate the impurity, while the coating film is on the upper and side surfaces of the gate electrode and on the heavily doped impurity diffusion regions, wherein the method further comprising controlling the thickness of the coating film to adjust a concentration of the impurity.

* * * * *